（12）United States Patent
Chu

(10) Patent No.: US 7,893,714 B2
(45) Date of Patent: Feb. 22, 2011

(54) HIGH VOLTAGE ANALOG MULTIPLEX SWITCH INTEGRATED CIRCUIT ARCHITECTURE

(75) Inventor: Ching Chu, San Jose, CA (US)

(73) Assignee: Supertex, Inc., Sunnyvale, CA (US)

( * ) Notice: Subject to any disclaimer, the term of this patent is extended or adjusted under 35 U.S.C. 154(b) by 66 days.

(21) Appl. No.: 12/367,310

(22) Filed: Feb. 6, 2009

(65) Prior Publication Data

US 2010/0201428 A1 Aug. 12, 2010

(51) Int. Cl.
*H03K 19/094* (2006.01)
*H03K 3/00* (2006.01)
(52) U.S. Cl. ......................................... 326/68; 327/109
(58) Field of Classification Search ........................ None
See application file for complete search history.

(56) References Cited

U.S. PATENT DOCUMENTS

| 2002/0041198 A1* | 4/2002 | Parris et al. ................. 327/408 |
| 2006/0287596 A1* | 12/2006 | Johnson et al. ............. 600/437 |
| 2008/0242987 A1* | 10/2008 | Shifrin ....................... 600/443 |
| 2010/0033411 A1* | 2/2010 | Lee ............................ 345/87 |

\* cited by examiner

*Primary Examiner*—Vibol Tan
*Assistant Examiner*—Dylan White
(74) *Attorney, Agent, or Firm*—Jeffrey D. Moy; Weiss & Moy, P.C.

(57) ABSTRACT

An integrated circuit high voltage analog switch has digital logic-level control interface circuit. A level translator is coupled to the digital logic-level control interface circuit. A plurality of output multi-channel high voltage switches is coupled to the level translator.

8 Claims, 5 Drawing Sheets

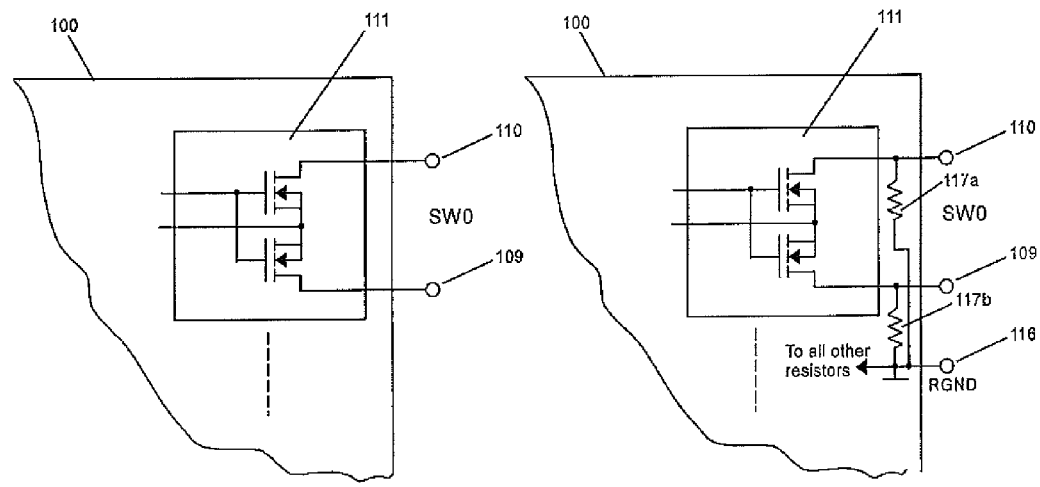
Figure 3A
(Prior Art)
Figure 3B
(Prior Art)
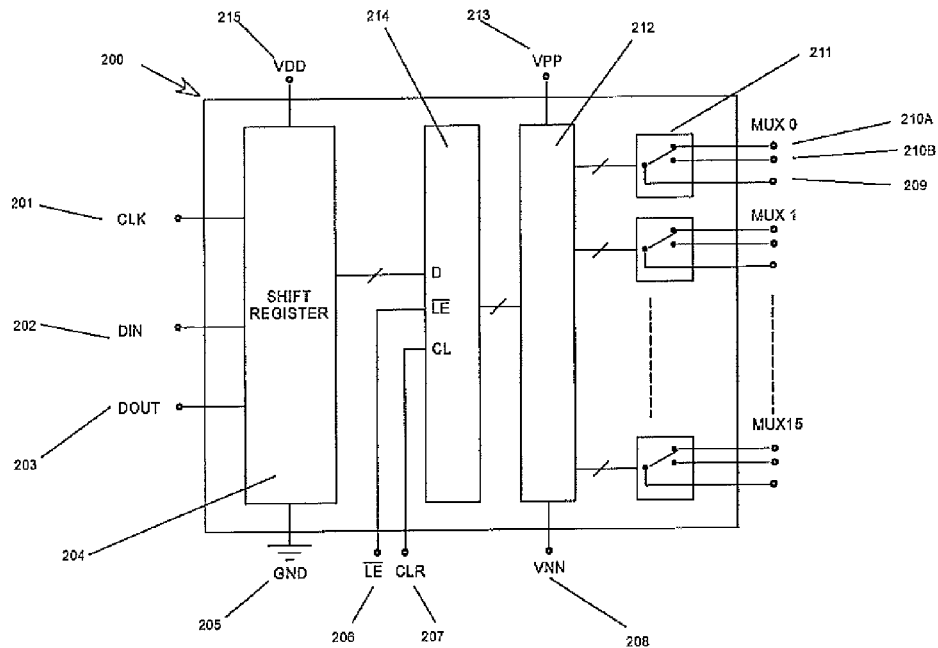
Figure 4

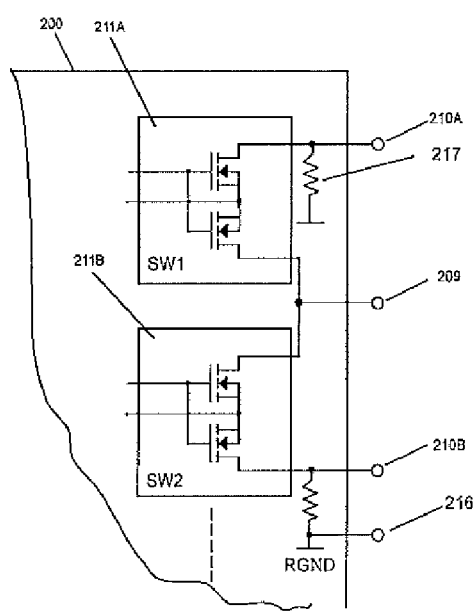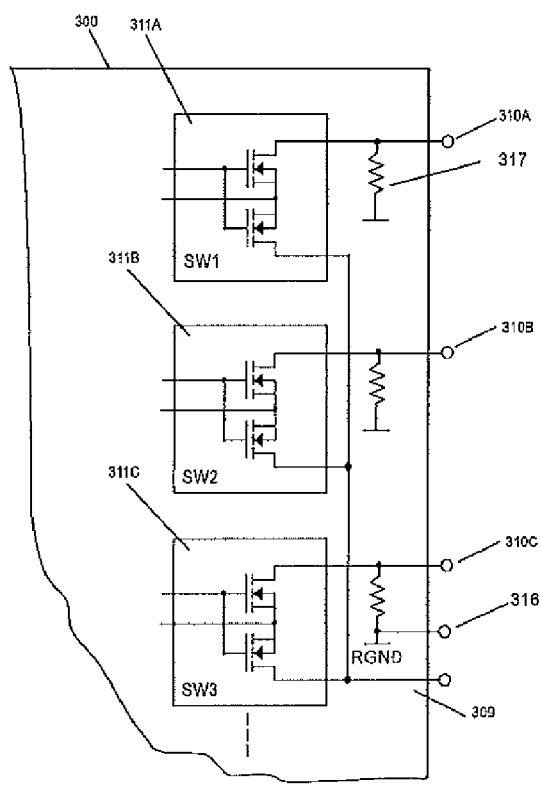
Figure 7A                    Figure 7B

HIGH VOLTAGE ANALOG MULTIPLEX SWITCH INTEGRATED CIRCUIT ARCHITECTURE

BACKGROUND

This invention relates to a programmable high voltage analog multiplex or de-multiplexer switch integrated circuit for ultrasound scanning image system, and more particularly, to an array of high voltage analog switches used for multiplexing or de-multiplexing between, for example, 64 transmitting/receiving channels of a high voltage ultrasound transmit pulse generator and ultrasound echo signal receiver to the 192 piezoelectric or capacitive-electrostatic elements in the ultrasound transducer probe in an ultrasound B-scan or a color image system.

Ultrasound medical imaging or nondestructive testing (NDT) application have a growing demand for more sophisticated excitation waveforms and sequential scanning method for large number of piezoelectric or capacitive-electrostatic elements array connected to the limited excitation source and echo signal receiver channels. A cost effective way for such system design is to directly use an array of high voltage analog switches forming multiplexer and de-multiplexer to connect the transducer elements in the probe and the transmitter/receiver channels. The commonly used ultrasound probe array contains 128, 192 or 256 piezoelectric or capacitive-electrostatic elements. These elements need to connect and work with 64 or 128 transmitter and receiver channels. Therefore it requests an array of 2:1 or 3:1 multiplexer or de-multiplexer in a very small size integrated circuit device. However the recent available high voltage switch integration lever of 8 or 16 switch channels per IC devices are no long meeting the application design and implementation requirement.

Therefore, it would be desirable to provide a circuit and method that overcomes the above problems. The circuit and method would be a high voltage analog multiplexer or de-multiplexer switch array integrated circuit device architecture topology for meeting these system design requirements.

An integrated circuit high voltage analog switch has digital logic-level control interface circuit. A level translator is coupled to the digital logic-level control interface circuit. A plurality of output multi-channel high voltage switches is coupled to the level translator.

The features, functions, and advantages can be achieved independently in various embodiments of the disclosure or may be combined in yet other embodiments,

BRIEF DESCRIPTION OF THE DRAWINGS

Embodiments of the disclosure will become more fully understood from the detailed description and the accompanying drawings, wherein:

FIGS. 3A and 3B is the schematic detail diagram illustrating one of the switch channels in the prior art high voltage analog switch array of 8 or 16-switch channels in the integrated device without (FIG. 3A) or with (FIG. 3B) the bleeding resistors at the switches terminals;

FIG. 4 is the schematic diagram illustrating the proposed new circuit architecture topology of the 16-multiplexer channels for the 32-elements as a 2 to 1 multiplexer/de-multiplexer in an integrated device;

FIGS. 7A and 7B is the schematic detail diagram illustrating one of the switch channels in the proposed new circuit of high voltage analog multiplexer array of 32-switch channels or 24 switch channels in the integrated device without (FIG. 7A) or with (FIG. 7B) the bleeding resistors at the switches terminals.

DETAILED DESCRIPTION

Figure 1:
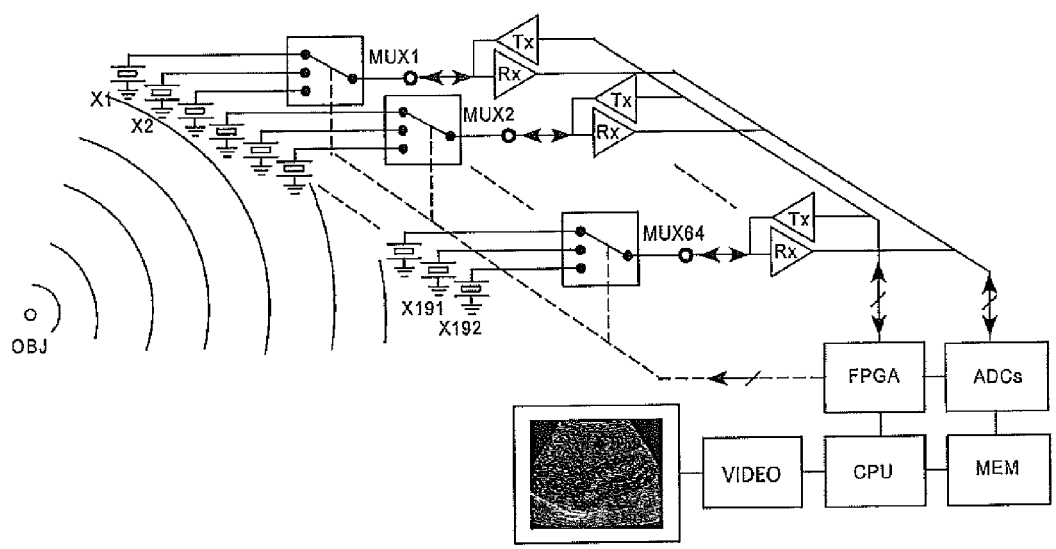
FIG. 1 is the schematic diagram illustrating a conventional example of an 192 piezoelectric or capacitive-electrostatic elements probe transducer array, through the high voltage analog multiplex switch, connecting to a 64-channel of ultrasound transmitter and receiver array in a typical ultrasound B-scan image system.

In various embodiments, the programmable ultrasound piezoelectric or capacitive-electrostatic transducer elements multiplexer or de-multiplexer devices provide digital controlled signal path for high voltage analog transmitting waveforms, and the ultrasound echo signal which contain the acoustic reflection and/or diffraction signal from the target object(s) for the ultrasound B-scan image system, Referring to FIG. 1, a prior art design of a programmable high voltage analog multiplex or de-multiplexer switch integrated circuit for ultrasound scanning image system 100 is shown. In this embodiment, the system 100 has a 192 piezoelectric or capacitive-electrostatic elements probe transducer array X1-X192. Each element of the array X1-X192 is coupled to one of a plurality of high voltage analog multiplex switches MUX1-MUX64 for connecting to an ultrasound transmitter and receiver array (Tx/Rx) in a typical ultrasound B-scan image system 102.

If this is an example of a 3 to 1 (3 piezoelectric or capacitive-electrostatic elements per multiplex switch) multiplexing system configuration of the B-scan or color scan ultrasound image system, for the lower cost system, the number of the piezoelectric or capacitive-electrostatic elements usually is 128 and the number of the ultrasound transmitter and receiver channels is kept to 64. The probe is usually held in the system operator hand, through an approximately 6-feet multichannel coaxial, very thin yet durable and flexible special ultrasound cable and expansive wideband RF impedance matched connector connected to the ultrasound main transmitter and receiver of the system PCB. In order to save the number of expansive high quality cable, usually the multiplexer and de-multiplexer circuits are placed inside of the probe. Therefore minimum in size or higher degree of integration is always aggressively demanded.

Figure 2:
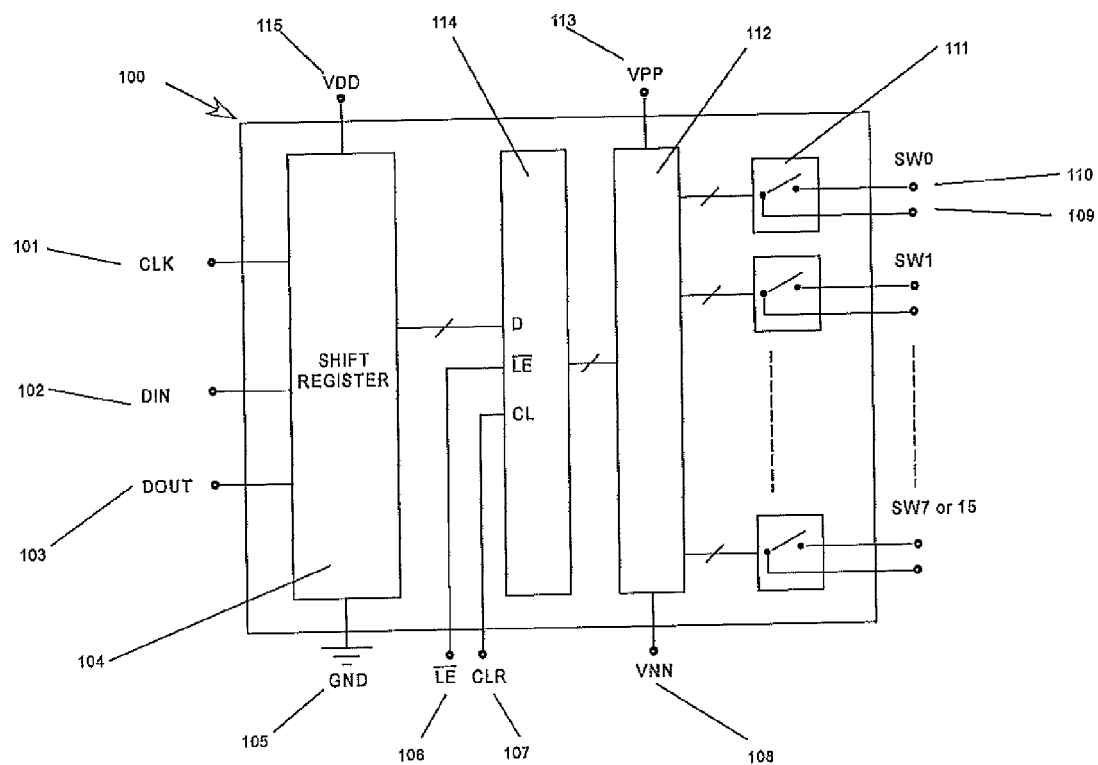
FIG. 2 is the schematic diagram illustrating the prior art of high voltage analog switch array circuit topology of 8 or 16-switch channels in an integrated device.

Referring to FIG. 2, a prior art high voltage analog switch configured as an 8-channel single switcher or 16-channel single switch is shown as clearly needing two pins per switch. Due to the number of pins per chip, for example a 16-channel of said switch IC needs a minimum of 32 pins for the output pin connections, plus the control input and power supply or bias voltage supply pin connections for a total of about 42 pins.

In FIG. 2, the prior art high voltage analog switch array circuit architecture topology of 8-switch channels or 16 switch channels in the integrated circuit device is shown as 100. As the digital control input and output signals, the serial shift register clock input signal 101, moves in the data input pin 102 status input the next bit of the shift register 104 at every rise edge of the clock. If the last bit of the register data is "1" then the data output pin 103 will be high. The shift register data will be latched in to the parallel-latch-register 114, when the pin of LE(bar) rising edge transition happens. When the LE(bar) pin is low, all the data will "flow-through" in parallel from the output of shift-register to the input of level-translator 112 input connections. When the latch-register output is "1" the output switcher will be closed, otherwise it will be open. When the clear signal input, CLR pin 107 is high, every output switch will be open or off. If the IC contain 8 switch channels, then there will be an 8-bit shift-register that connects to an 8-bit latch-register then to an 8-channel of low voltage (3.3 V to 5 V or 12 V typical) to high voltage (+/−100 typical) level-translators. Then there will be an 8-channel of output switches 111, etc.

Referring to FIG. 3A, the detail implementation of each switch 111, with two "back-back" N-channel type of MOSFETs is shown. The drains of the two MOSFETs are connected out as 109 and 110 the output switcher's terminals. When the MOSFETs are turned on, the switch 111 is closed, when the MOSFETs are off the switch 111 is open.

FIG. 3B shows the switch 111 with switch output bleeding resistors 117a and 117b attached to each terminal and to a common RGND pin 116. The resistors 117a and 117b are there as discharge path for piezoelectric or capacitive-electrostatic etc., any capacitance load of the switch, in the case of any unwanted electrical charges accumulated on them. Such unwanted electrical charge could be, for example the leakage of the high voltage bias circuit is the IC or on the PCB board etc. Usually the values of the bleeding resistors are between 20 to 50 k-ohm.

The 8-switch channels and 16-switch channels device can be packaged into a 48 leads LQFP IC package with 0.5 mm pin-pitch. There is a minimum pin-pitch that is required by the high voltage clearance of the PCB board design for surface pin to pin high voltage creepage distance. Therefore to further increase the IC circuit area density and designing more channels of the switches in one IC device, will be limited by the pin counters.

FIG. 4 shows a novel circuit topology of 32-switch channels constructed with 16 multiplexers on a single intergraded circuit chip 200. In this new architecture topology of the circuit 200, the 16 multiplexers 211 are configured as 2 to 1 multiplexer or de-multiplexer with three terminals 210A, 210B and 209 per channel. This 32-switch channel, 16-multiplexer or de-multiplexer (2 to 1) channels design architecture can reduce the pin count and fit the design into enough number of pins of the package with enough pin-pitch size. The said packaged device will have higher channel density and PCB area density than the 8 or 16-switch channel devices.

Figure 5:
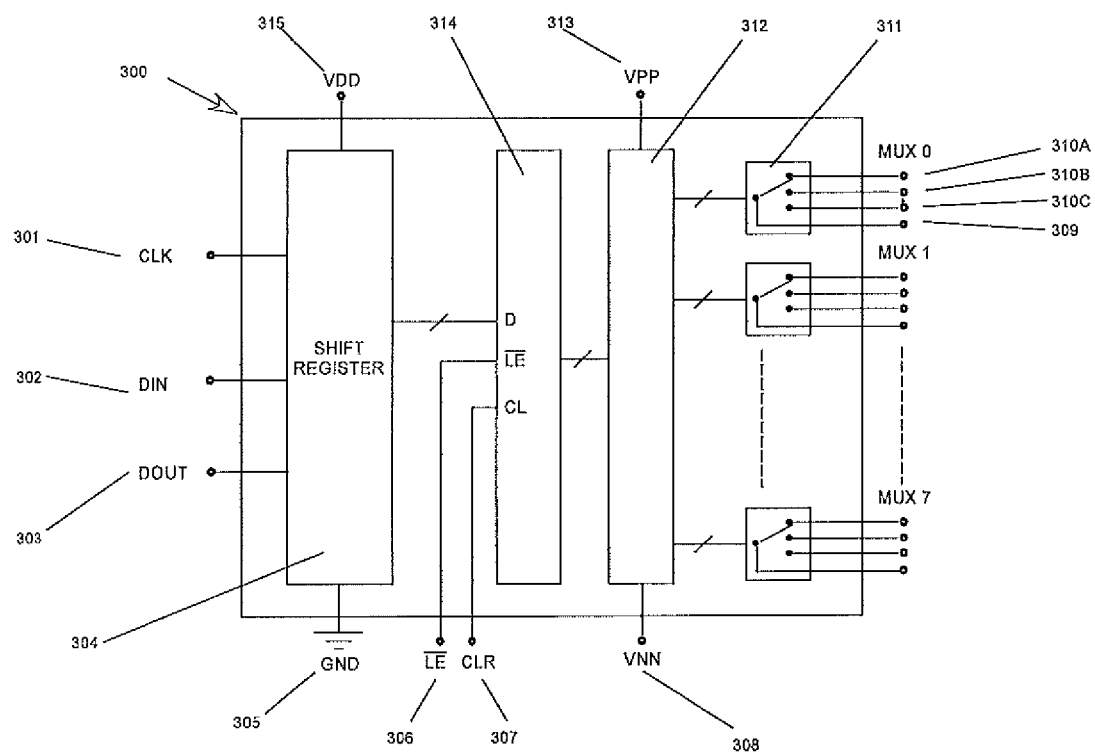
FIG. 5 is the schematic diagram illustrating the proposed new circuit architecture topology of the 8- multiplexer channels for the 24-elements as a 3 to 1 multiplexer/de-multiplexer in an integrated device.

Referring to FIG. 5, a proposed novel circuit topology of 24-switch channels constructed with 8 multiplexers into an intergraded circuit chip 300. In this new architecture topology of the circuit, the 8 multiplexers 311 are configured as 3 to 1 multiplexer or de-multiplexer with only three terminals 310A, 310B, 310C and 309 per channel. This 24-switch channel, 8-multiplexer of de-multiplexer (3 to 1) channels design architecture can reduce the pin counters and fit the design into the enough number of pins of the package with enough pin-pitch size. The said packaged device will have higher channel density and PCB area density than the 8 or 16-switch channel devices.

Figures 6A, 6B:
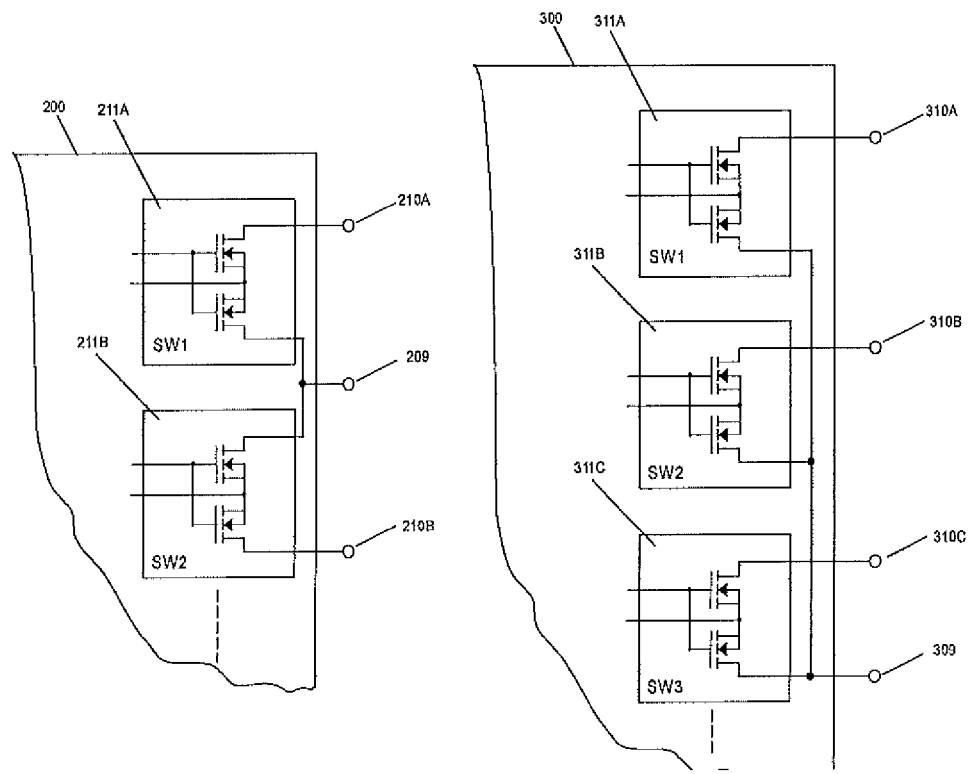
FIG. 6 is a schematic detail diagram illustrating one of the multiplexer/de-multiplexer channels in the proposed new high voltage analog 2 to 1 and 3 to 1 multiplexer de-multiplexer switch array in the integrated device.

FIG. 6A shows the detail wiring of the high voltage switches 211A, 211B of one of the 2 to 1 multiplexer or de-multiplexer channel to its terminals of 210A, 210B and 209. As shown in FIG. 6A, each switch 211A, 211B comprises two "back-back" N-channel type MOSFETs M1 and M2. The switches 211A, 211B are connected to form a common terminal 209. In the embodiment shown, a terminal of the MOSFET M2 of switch SW1 is connected to a terminal of the MOSFET M1 of the switch SW2 to form the common terminal 209.

FIG. 6B shows the detail wiring of the high voltage switches 311A, 311B and 311C of one of the 3 to 1 multiplexer or de-multiplexer channel to its terminals of 310A, 310B, 310C and 309. As shown in FIG. 6B, each switch 311A, 311B, 311B comprises two "back-back" N-channel type MOSFETs M1 and M2. The switches 311A, 311B, 311C are connected to form a common terminal 309.

FIG. 7A and FIG. 7B show the detail wiring of the high voltage switch MOSFETs of one of the 2:1 and 3:1 multiplexer or de-multiplexer channel with bleeding resistors 217 and/or 317. The bleeding resistors are only required at the terminals which are connected to the said capacitive loads to discharge the leakage cased accumulations.

While embodiments of the disclosure have been described in terms of various specific embodiments, those skilled in the art will recognize that the embodiments of the disclosure can be practiced with modifications within the spirit and scope of the claims.

What is claimed is:

1. An integrated circuit high voltage analog switch comprising:
    a digital logic-level control interface circuit;
    a level translator coupled to the digital logic-level control interface circuit;
    a plurality of output multi-channel high voltage switches coupled to the level translator;
    wherein each of the plurality of output multi-channel high voltage switches comprises a first and second MOSFET, a second MOSFET of each output multi-channel high voltage switch is coupled to a first MOSFET of a successive output multi-channel high voltage switch to form a common terminal between successive output multi-channel high voltage switches.

2. An integrated circuit high voltage analog switch in accordance with claim 1 wherein the plurality of output multi-channel high voltage switches is a plurality of multiplexors/demultiplexors.

3. An integrated circuit high voltage analog switch in accordance with claim 2 wherein the plurality of multiplexors/demultiplexors are configured as one of: 2 to 1, 3 to 1, or more to 1 multiplexers providing one of 15, 16, 24 or 32 switch channels.

4. An integrated circuit high voltage analog switch comprising:
    a digital logic-level control interface circuit;
    a level translator coupled to the digital logic-level control interface circuit;
    a plurality of output multi-channel high voltage switches coupled to the level translator, wherein successive output multi-channel high voltage switches are connected together to form a common terminal between successive output multi-channel high voltage switches;
    wherein each of the plurality of output multi-channel high voltage switches comprises a first and second MOSFET, a second MOSFET of each output multi-channel high voltage switch is coupled to a first MOSFET of a successive output multi-channel high voltage switch to form a common terminal.

5. An integrated circuit high voltage analog switch in accordance with claim 4 wherein the plurality of output multi-channel high voltage switches are a plurality of multiplexors/demultiplexors, the plurality of multiplexors/demultiplexors are configured as one of: 2 to 1, 3 to 1, or more to 1 multiplexers providing one of 15, 16, 24 or 32 switch channels.

6. An ultrasound imaging system having an integrated circuit high voltage analog switching circuit in accordance with claim 5 wherein the plurality of multiplexors/demultiplexors configured as one of: 2 to 1, 3 to 1, or more to 1 multiplexers.

7. An ultrasound imaging system having an integrated circuit high voltage analog switching circuit in accordance with claim 5 wherein the digital logic-level control interface circuit comprises:
   a shift register having a data input pin, data output pin and a clock signal pin; and
   a latch register coupled to an output of the shift register and an output coupled to the level translator.

8. An ultrasound imaging system having an integrated circuit high voltage analog switching circuit comprising:
   a digital logic-level control interface circuit;
   a level translator coupled to the digital logic-level control interface circuit;
   a plurality of multiplexors/demultiplexors, wherein successive multiplexors/demultiplexors are connected together to form a common terminal;
   wherein each of the plurality of multiplexors/demultiplexors comprises a first and second MOSFET, a second MOSFET of each of the multiplexors/demultiplexors is coupled a first MOSFET of a successive multiplexors/demultiplexors to form a common terminal.

* * * * *